United States Patent
Cohen et al.

(10) Patent No.: US 9,281,835 B2
(45) Date of Patent: Mar. 8, 2016

(54) METHOD AND APPARATUS FOR WIDE RANGE INPUT FOR AN ANALOG TO DIGITAL CONVERTER

(71) Applicant: Microsemi Corp.—Analog Mixed Signal Group Ltd., Hod Hasharon (IL)

(72) Inventors: Shimon Cohen, Burgata (IL); Gabi Levhar, Ruhama (IL)

(73) Assignee: Microsemi Corp.—Analog Mixed Signal Group, Ltd., Hod Hasharon (IL)

( * ) Notice: Subject to any disclaimer, the term of this patent is extended or adjusted under 35 U.S.C. 154(b) by 0 days.

(21) Appl. No.: 14/623,550

(22) Filed: Feb. 17, 2015

(65) Prior Publication Data

US 2015/0249464 A1  Sep. 3, 2015

Related U.S. Application Data

(60) Provisional application No. 61/946,941, filed on Mar. 3, 2014.

(51) Int. Cl.
  *H03M 1/12* (2006.01)
  *H03M 1/18* (2006.01)
  H05B 33/08 (2006.01)
  H03M 1/00 (2006.01)

(52) U.S. Cl.
  CPC . *H03M 1/18* (2013.01); *H03M 1/00* (2013.01); *H03M 1/12* (2013.01); *H05B 33/0815* (2013.01)

(58) Field of Classification Search
  CPC ....... H03M 1/12; H03M 1/00; H05B 33/0815
  USPC ................... 341/155, 156, 120, 122; 315/297
  See application file for complete search history.

(56) References Cited

U.S. PATENT DOCUMENTS

| | | | |
|---|---|---|---|
| 7,728,655 B2 | 6/2010 | Ng et al. | |
| 8,373,449 B2 | 2/2013 | Thiele et al. | |
| 8,816,891 B2 | 8/2014 | Cohen | |
| 8,988,141 B2 | 3/2015 | Cohen | |
| 2010/0026208 A1* | 2/2010 | Shteynberg et al. | 315/297 |
| 2013/0207192 A1 | 8/2013 | Parthasarathy et al. | |

OTHER PUBLICATIONS

AN10322—Current Sensing Power MOSFETS; Application Note published by NXP B.V. Jun. 24, 2009; downloaded from www.nxp.com.

* cited by examiner

*Primary Examiner* — Joseph Lauture
(74) *Attorney, Agent, or Firm* — Simon Kahn

(57) ABSTRACT

A method of providing a wide range of input currents for an analog to digital converter (ADC), the method constituted of: receiving an input current; selecting one of a plurality of selectable ratios; and generating at least one sense current, the magnitudes of the at least one generated sense current and the received input current exhibiting the selected ratio, wherein the ADC is arranged to receive a voltage representation of the at least one generated sense current.

20 Claims, 10 Drawing Sheets

| 1000 | CONTROL MUX TO PASS VLIMIT TO ADC – OPT. DETERMINE R |
| --- | --- |
| 1010 | CONTROL MUX TO PASS VSENSE TO ADC |
| 1020 | DETERMINE IPORT RESPONSIVE TO VSENSE AND DETERMINED VALUE OF R |
| 1030 | OUTPUT VALUE OF IPORT |

METHOD AND APPARATUS FOR WIDE RANGE INPUT FOR AN ANALOG TO DIGITAL CONVERTER

TECHNICAL FIELD

The invention relates generally to the field of analog to digital converters and particularly to an input circuitry for an analog to digital converter arranged to receive a wide range of currents.

BACKGROUND

In many applications an electronic chip is provided to perform one or more functions, including the control of current provided to an external device, or load. In order to ensure proper powering of the external device, or load, the provided current should be measured. For example, Power over Ethernet (PoE), in accordance with both IEEE 802.3af-2003 and IEEE 802.3at-2009, each published by the Institute of Electrical and Electronics Engineers, Inc., New York, the entire contents of each of which is incorporated herein by reference, defines delivery of power over a set of 2 twisted wire pairs without disturbing data communication. The aforementioned standards particularly provide for a power sourcing equipment (PSE) and one or more powered devices (PD). In a first stage of operation, the PSE is arranged to output to each PD a class current, typically ranging from 0-50 mA, in order to determine the class of the PD. In the operating stage of operation, the PSE is arranged to output an operating current, typically ranging from 350 mA up to 1 A for higher power applications being currently considered. In both stages, the current output by the PSE should be measured in order to determine if there is enough power for all of the PDs.

Unfortunately, analog to digital converters (ADCs) capable of properly converting such a wide range of currents adds additional costs. There is thus a long felt need for an arrangement allowing for the conversion of a wide range of input currents by a standard ADC not arranged to handle such a wide range of input.

SUMMARY OF THE INVENTION

Accordingly, it is a principal object of the present invention to overcome the disadvantages of prior art ADC input circuitries. In one embodiment, a wide range input current circuitry for an analog to digital converter (ADC) is provided, the wide range input current circuitry comprising: a first resistor coupled to an input of the ADC; a first electronically controlled switch coupled to the first resistor; a second resistor coupled to the input of the ADC and arranged to provide a current path for an input current; a control circuitry in communication with the first electronically controlled switch and arranged to alternately open and close the first electronically controlled switch, wherein the control circuitry is arranged to operate in a high current mode in the event that the input current exhibits an intensity within a first predetermined range and is arranged to operate in a low current mode in the event that the input current exhibits an intensity within a second predetermined range, lower than the first predetermined range, wherein, in the high current mode, the control circuitry is arranged to close the first electronically controlled switch, the first electronically controlled switch arranged when closed to provide a current path for the input current through the first resistor, and wherein, in the low current mode, the control circuitry is arranged to open the first electronically controlled switch, the first electronically controlled switch arranged when opened to prevent the flow of the input current through the first resistor.

In one further embodiment, the circuitry further comprises a second electronically controlled switch coupled to the second resistor, wherein responsive to both the high current mode and low current mode of the control circuitry, the second electronically controlled switch is arranged to be closed, and wherein the ratio between the area of the first electronically controlled switch and the area of the second electronically controlled switch is equal to the ratio between the resistance of the second resistor and the resistance of the first resistor.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

DETAILED DESCRIPTION OF THE PREFERRED EMBODIMENTS

Figure 1A:
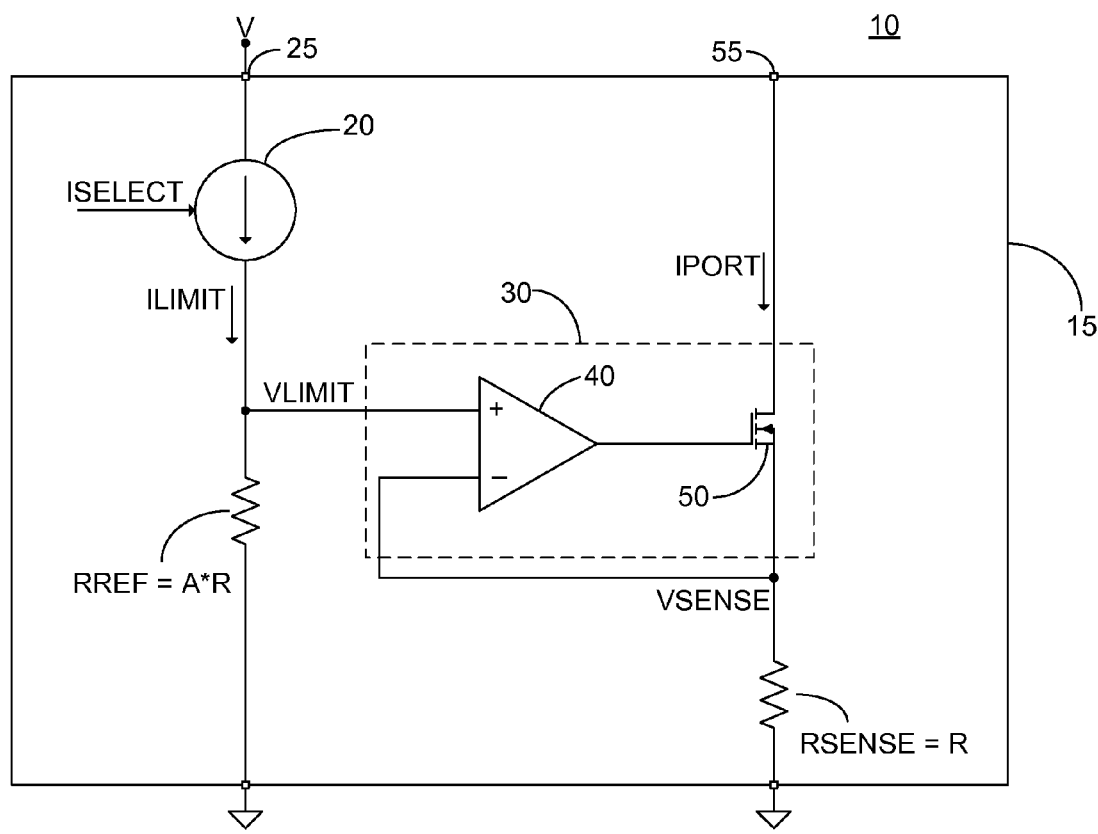
FIG. 1A illustrates a high level schematic diagram of an on-chip port current control arrangement utilizing a variable current source.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting. The term resistor as used herein refers to an element defined in an integrated circuit arranged to present resistance to a current flow there through.

FIG. 1A illustrates a high level schematic diagram of an on-chip port current control arrangement 10. Arrangement 10 comprises: an integrated circuit 15; a reference current source 20; a current control circuitry 30 comprising a differential amplifier 40 and an electronically controlled switch 50; an on-chip reference resistor, denoted RREF; and an on-chip sense resistor, denoted RSENSE. Reference current source 20 is preferably variable over a plurality of predetermined values, responsive to a control input, denoted ISELECT. In one embodiment, reference current source 20, current control circuitry 30, on-chip reference resistor RREF and on-chip sense resistor RSENSE are all defined on integrated circuit 15. In another embodiment, reference current source 20 is external of integrated circuit 15. In one embodiment, differential amplifier 40 comprises an operational amplifier. Electronically controlled switch 50 is arranged to adjust the intensity of current flowing there through responsive to the output of differential amplifier 40. Electronically controlled switch 50 is described below as being implemented as an n-channel metal-oxide field effect transistor (NMOSFET), however this is not meant to be limiting in any way and other electronically controlled switches arranged to adjust the intensity of current flowing therethrough may be provided. As described above, on-chip resistors, such as sense resistor RSENSE and reference resistor RREF, exhibit an approximately know resistance with a large tolerance due to manufacturing limitations. However, the ratio between the resistances of different resistors on a single electronic chip is known with a sufficient accuracy, and is temperature independent since any temperature dependent change in the resistors are in-step. The resistance of sense resistor RSENSE is denoted R and the resistance of reference resistor RREF is denoted A*R, where A is an accurately known predetermined constant such that the resistance of reference resistor RREF is given as a factor of the resistance of sense resistor RSENSE. There is no requirement that the value of A be greater than 1, and thus RREF may have a greater resistance that RSENSE, a resistance less than that of RSENSE or a resistance substantially equal to that of RSENSE without exceeding the scope. The resistances thus exhibit a predetermined relationship, preferably a predetermined fixed temperature independent mathematic relationship.

Reference resistor RREF is illustrated as being a single resistor in series with variable reference current source 20, however this is not meant to be limiting in any way. In another embodiment, as will be described further below in relation to FIG. 1B, reference current source 20 is fixed, and reference resistor RREF is constituted of a plurality of series connected resistors.

An input of reference current source 20 is coupled to a port 25 of integrated circuit 15 and port 25 is coupled to an external source voltage, denoted V. The amount of current generated by reference current source 20 is preferably controlled by input ISELECT. The output of reference current source 20, denoted ILIMIT, is coupled to a first end of reference resistor RREF and to the non-inverting input of differential amplifier 40 and a second end of reference resistor RREF is coupled to a common potential. The inverting input of differential amplifier 40 is coupled to a first end of sense resistor RSENSE and to the source of electronically controlled switch 50 and a second end of sense resistor RSENSE is coupled to the common potential. The output of differential amplifier 40 is coupled to the gate of electronically controlled switch 50 and the drain of electronically controlled switch 50 is coupled to a port 55 of integrated circuit 15. Port 55 carries the port current, i.e. the current to be measured and/or controlled.

In one non-limiting embodiment, port 55 is the negative leg of a PoE system, as described above in relation to IEEE 802.3 of or IEEE 802.3 at. In such an embodiment, the common potential is a return to a DC power source, typically at about −48V DC in relation to ground potential.

In operation, reference current source 20 is arranged to generate limit reference current ILIMIT, of a predetermined value. Limit reference current ILIMIT flows through reference resistor RREF and produces a limit voltage there across, the voltage denoted VLIMIT, which is received at the non-inverting input of differential amplifier 40. Port 55 is arranged to receive a port current, denoted IPORT. Current IPORT flows through electronically controlled switch 50 and sense resistor RSENSE to the common potential and produces a sensed voltage across sense resistor RSENSE, the sensed voltage denoted VSENSE. The difference between limit voltage VLIMIT and sensed voltage VSENSE is amplified by differential amplifier 40 and current IPORT is limited responsive to the output of differential amplifier 40. In particular, in the event that sensed voltage VSENSE is greater than limit voltage VLIMIT, the resistance of electronically controlled switch 50, i.e. the $RDS_{on}$ of electronically controlled switch 50 is increased, thereby reducing port current IPORT. In the event that sensed voltage VSENSE is less than limit voltage VLIMIT, the $RDS_{on}$ of electronically controlled switch 50 is decreased thereby allowing for an increase in port current IPORT. The operation of current control circuitry 30 is thus arranged to cause sensed voltage VSENSE to be less than or equal to limit voltage VLIMIT, as known in the art. In certain embodiments sensed voltage VSENSE may be less than VLIMIT, such as when the circuitry attached to port 55 only passes a current less than A*ILIMIT. In such a case, electronically controlled switch 50 is fully on, i.e. $RDS_{on}$ is at its minimum responsive to the output of differential amplifier 40, however IPORT is limited by a load circuitry connected to port 55. Thus current control circuitry 30 acts as a current governor, wherein IPORT can not exceed A*ILIMIT, but in certain circumstances may be less than A*ILIMIT.

As will be described below, port current IPORT can thus be accurately controlled to not exceed a predetermined limit by selecting an appropriate limit reference current ILIMIT. In particular, EQ. 1 shows the relationship between port current IPORT and sense voltage VSENSE for a case wherein current is being limited by current control circuitry 30:

$$IPORT=VSENSE/R \qquad \text{EQ. 1}$$

where R is the resistance of sense resistor RSENSE, which as described above is unknown.

As described above, current control circuitry 30 is arranged to cause sense voltage VSENSE to be equal to reference voltage VLIMIT. Therefore, EQ. 1 can be rewritten as:

$$IPORT=VLIMIT/R \qquad \text{EQ. 2}$$

The relationship between reference voltage VLIMIT and limit reference current ILIMIT is given as:

$$VLIMIT=ILIMIT*A*R \qquad \text{EQ. 3}$$

where, as described above, R is the resistance of sense resistor RSENSE and A is a predetermined constant, A*R being the resistance of reference resistor RREF.

The combination of EQ. 2 and EQ. 3 provides the relationship between current port IPORT when limited, and limit reference current ILIMIT, which is independent of the unknown value R, as:

$$IPORT=ILIMIT*A \qquad \text{EQ. 4}$$

Thus, on-chip port current control arrangement 10 limits port current IPORT as a known function of limit reference current ILIMIT. Port current IPORT can thus be limited to a predetermined value by setting the value of limit reference current ILIMIT, without requiring precise knowledge of the value of RSENSE.

Figure 1B:
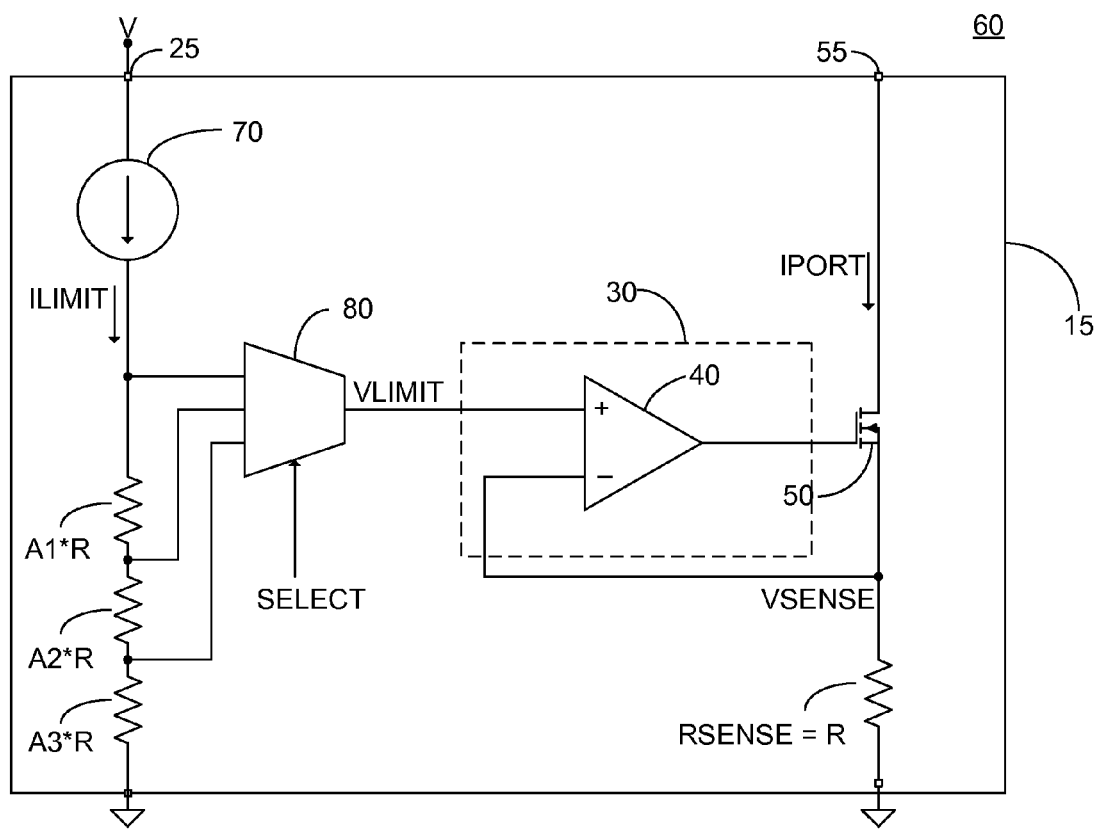
FIG. 1B illustrates a high level schematic diagram of an on-chip port current control arrangement utilizing a selectable reference resistor.

FIG. 1B illustrates a high level schematic diagram of an on-chip port current control arrangement 60 utilizing a selectable reference resistor. On-chip port current control arrangement 60 is in all respects identical with that of on-chip port current control arrangement 10, with the exception that a plurality of selectable reference resistors, of value A1*R; A2*R and A3*R are provided, the resistors being denoted by their values for simplicity. In particular, fixed current source 70 is provided in place of variable current source 20, and is arranged to provide a fixed current ILIMIT. The output of fixed current source 70 is coupled to a first end of resistor A1*R, and to a first input of a multiplexer 80. A second end of resistor A1*R is coupled to a second input of multiplexer 80 and to first end of resistor A2*R. A second end of resistor A2*R is coupled to a third input of multiplexer 80 and to a first end of resistor A3*R. A second end of resistor A3*R is coupled to the common potential. A select input is provided for multiplexer 80. The output of multiplexer 80 is denoted VLIMIT and is coupled to the non-inverting input of differential amplifier 40. Three reference resistors A1*R; A2*R and A3*R are illustrated, however this is not meant to be limiting in any way, and any number of reference resistors may be provided without exceeding the scope.

In operation, input SELECT determines the resistance experienced by ILIMIT, and thus VLIMIT. Port current IPORT is again limited responsive to A, which may be a linear combination of A1, A2, A3 as selected by multiplexer 80 responsive to input select. Thus, with a single fixed reference current source 70 a plurality of values for VLIMIT may be generated of a fixed ratio between them, responsive to the ratio of the constituent resistors forming reference resistor RREF, thus allowing for a plurality of current limits to be set for current control circuitry 30.

The above is illustrated in an embodiment wherein reference resistors A1*R, A2*R and A3*R are serially connected, however this is not meant to be limiting in any way, and parallel connections may implemented without exceeding the scope.

Figures 2A, 2B:
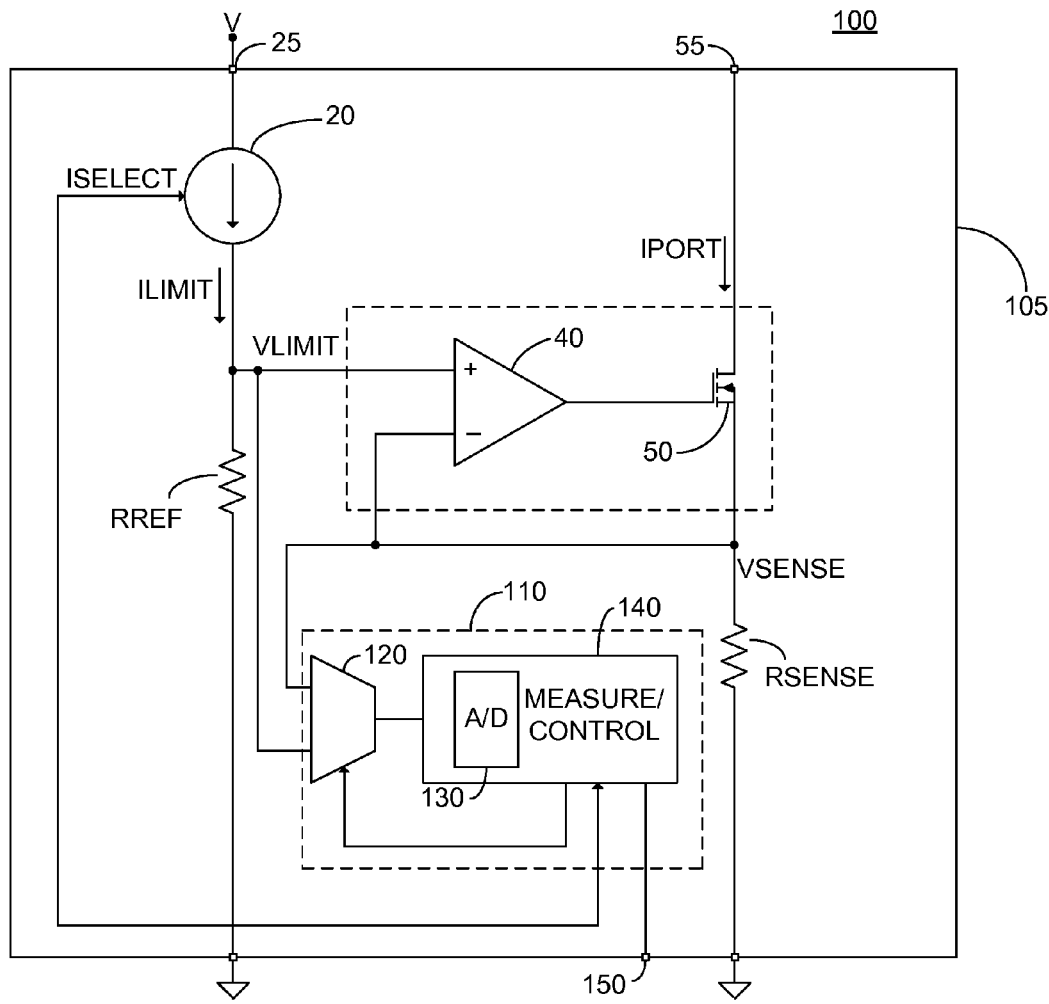
FIG. 2A illustrates a high level schematic diagram of the on-chip port current control arrangement of FIG. 1 further comprising a port current determining circuitry.
FIG. 2B illustrates a high level flow chart of the method of operation of the port current determining circuitry of FIG. 2A.

FIG. 2A illustrates a high level schematic diagram of an on-chip port current control arrangement 100, which further provides for precise measurement of actual port current IPORT. On-chip port current control arrangement 100 comprises: an integrated circuit 105; a port current measuring circuitry 110; a reference current source 20; on-chip reference resistor RREF; on-chip sense resistor RSENSE; and current control circuitry 30 comprising differential amplifier 40 and electronically controlled switch 50. Port current measuring circuitry 110 comprises: a multiplexer 120; and a current measuring circuitry control 140, comprising therein an analog to digital converter (ADC) 130. In one embodiment, reference current source 20, on-chip reference resistor RREF, on-chip sense resistor RSENSE and port current measuring circuitry 110 are all defined on integrated circuit 105. In another embodiment, reference current source 20 is external of integrated circuit 105. As described above, on-chip resistors, such as sense resistor RSENSE and reference resistor RREF, exhibit an approximately known resistance with a large tolerance due to manufacturing limitations. However, the ratio between the resistances of different resistors on a single electronic integrated circuit area is known with a sufficient accuracy. The resistance of sense resistor RSENSE is denoted R and the resistance of reference resistor RREF is denoted A*R, where A is an accurately known predetermined constant such that the resistance of reference resistor RREF is given as a multiple of the resistance of sense resistor RSENSE, as described above in relation to FIGS. 1A, 1B. The embodiment of port current control arrangement 10 of FIG. 1A is illustrated for convenience, however port current control arrangement 60 of FIG. 1B may implemented without exceeding the scope.

ADC 130 is shown integrated within current measuring circuitry control 140, however this is not meant to be limiting in any way. ADC 130 may be provided within multiplexer 120, separate ADC units may be provided ahead of multiplexer 120 for each of the inputs, or ADC 130 may not be provided at all, without exceeding the scope.

An input of reference current source 20 is coupled to a port 25 of integrated circuit 105 and port 25 is coupled to an external source voltage, denoted V. The output of reference current source 20 is coupled to a first end of reference resistor RREF, to a first input of multiplexer 120 and to the non-inverting input of differential amplifier 40 of current control circuitry 30. A second end of reference resistor RREF is coupled to a common potential. A first end of sense resistor RSENSE is coupled to port 55 of integrated circuit 105, to a second input of multiplexer 120 and to the inverting input of differential amplifier 40. A second end of sense resistor RSENSE is coupled to the common potential. An output of multiplexer 120 is coupled to an input of current measuring circuitry control 140, particularly to an input of ADC 130. A first output of current measuring circuitry control 140 is coupled to a control input of multiplexer 120 and a second output of current measuring circuitry control 140 is coupled to a port 150 of integrated circuit 105. Input ISELECT is connected to each of a control input of reference current source 20 and measuring circuitry control 140. Additionally, a fixed multiplier may be provided between multiplexer 120 and ADC 130 without exceeding the scope.

FIG. 2B illustrates a high level flow chart of a method of operation of port current measuring circuitry 110 of FIG. 2A, the figures being described together. As described above, a reference voltage VLIMIT is produced across on-chip reference resistor RREF responsive to a predetermined value of ILIMIT, and in stage 1000 current measuring circuitry control 140 is arranged to control multiplexer 120 to pass reference voltage VLIMIT to ADC 130 of current measuring circuitry control 140. ADC 130 is arranged to convert reference voltage VLIMIT to a digital signal reflecting the value of VLIMIT. As described above the value of RREF is not known with precision, only the ratio between RREF and RSENSE, namely A is known. Additionally, responsive to various factors, such as temperature, the value of RREF and RSENSE may fluctuate, however ratio A between them remains constant, and as indicated above is known factor.

Utilizing EQ. 3 above, current measuring circuitry control 140 optionally determines R, i.e. the actual resistance of RSENSE, as:

$$R = V\text{LIMIT}/(I\text{LIMIT}*A) \quad \text{EQ. 5}$$

There is no requirement that R be actually determined, as will be explained further below.

In stage 1010 current measuring circuitry control 140 is arranged to control multiplexer 120 to pass sense voltage VSENSE to ADC 130. ADC 130 is arranged to convert sense voltage VSENSE to a digital signal and pass the digital signal to current measuring circuitry control 140.

In stage 1020, current measuring circuitry control 140 is arranged to determine port current IPORT responsive to the sense voltage VSENSE of stage 1010 and the determined R of stage 1000 as:

$$I\text{PORT} = V\text{SENSE}/R \quad \text{EQ. 6}$$

Thus, responsive to the measurement of VLIMIT, an accurate measure of IPORT is determined by current measuring circuitry control 140. Alternately, by combining EQ. 6 with EQ. 5, IPORT may be determined without determination of R as:

$$I\text{PORT} = V\text{SENSE}*I\text{LIMIT}*A/V\text{LIMIT} \quad \text{EQ. 7}$$

In stage 1030, the measured value of port current IPORT is output via port 150 of integrated circuit 105.

In one embodiment, stage 1000 is run periodically so as to update the value of R to take into account temperature effects. In another embodiment, stage 1000 is run responsive to a detected change in the temperature of integrated circuit 105. Stages 1010-1030 are run continuously so as to provide accurate measurement of IPORT.

Thus, the circuitry and method of FIGS. 2A-2B cooperate to determine the actual value of RSENSE, and the resultant actual value of IPORT. Such a value of IPORT is preferable for accurate reporting of power usage, and thus control of overall power usage, without limitation. However, ADC 130 sees a full range of port currents reflected by VSENSE, which may add to cost.

Figure 3:
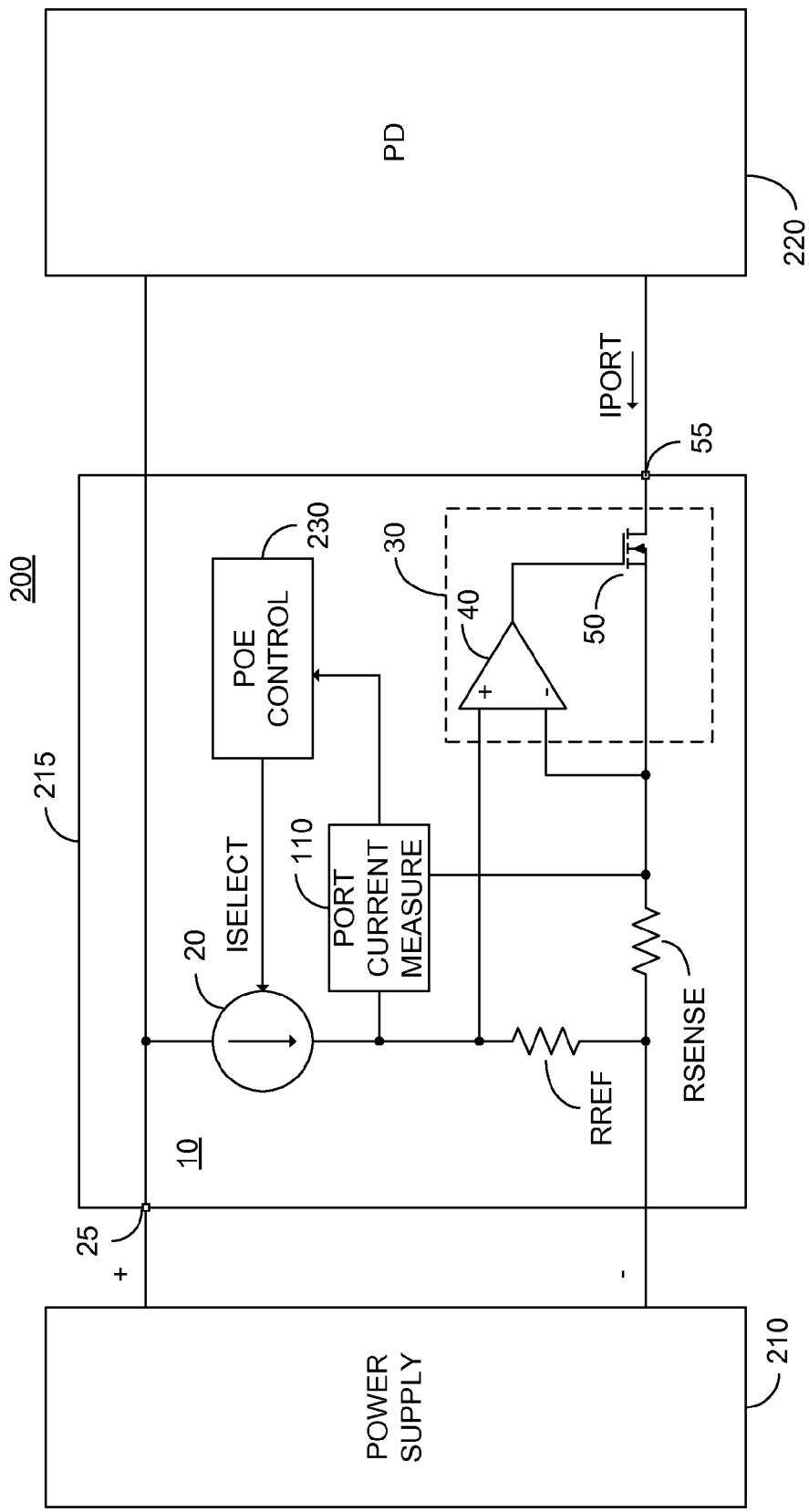
FIG. 3 illustrates a high level block diagram of a PoE system utilizing the on-chip port current control arrangement of FIG. 1.

FIG. 3 illustrates a high level block diagram of a PoE system 200 utilizing on-chip port current control arrangement 10 of FIG. 1. In particular PoE system 200 comprises a power supply 210, a powered device 220 and an integrated circuit 215, particularly a PoE controller. PoE controller 215 comprises reference current source 20; ports 25 and 55; resistors RREF and RSENSE; current control circuitry 30; port current measuring circuitry 110; and PoE control circuitry 230. The positive output of power supply 210 is coupled to PD 220 via port 25, and is further coupled to the first end of reference current source 20. The second end of reference current source 20 is coupled to an input of port current measuring circuitry 110, to a first end of reference resistor RREF and to a first input of current control circuitry 30, particularly to the non-inverting input of differential amplifier 40 thereof. The second end of on-chip reference resistor RREF is coupled to the return of power supply 210 and to the second end of on-chip sense resistor RSENSE. The first end of on-chip sense resistor RSENSE is coupled to a second input of current control circuitry 30, particularly to the inverting input of differential amplifier 40 thereof, to the source of electronically controlled switch 50 of current control circuitry 30 and to a second input of port current measuring circuitry 110. The output of difference amplifier 40 is coupled to the gate of electronically controlled switch 50, and the drain of electronically controlled switch 50 is coupled to the return from PD 220 via port 55. The output of port current measuring circuitry 110 is coupled to an input of PoE control circuitry 230, and an output of PoE control circuitry 230, denoted ISELECT is coupled to the control input of reference current source 20.

In operation, PoE system 200 provides power from power supply 210 to PD 200 over a twisted wire pair connection, as described in the above mentioned standards. The return current, denoted IPORT, as described above, is received at port 55, and is controlled, and particularly limited to a value, by the value of the current output by reference current source 20. Accurate reporting of the current through port 55 is accomplished by port current measuring circuitry 110, which may be as provided above, or as will be described further below. Optionally, an additional port 50 is provided (not shown) to provide information regarding the determined port current to other circuitry.

Figure 4A:
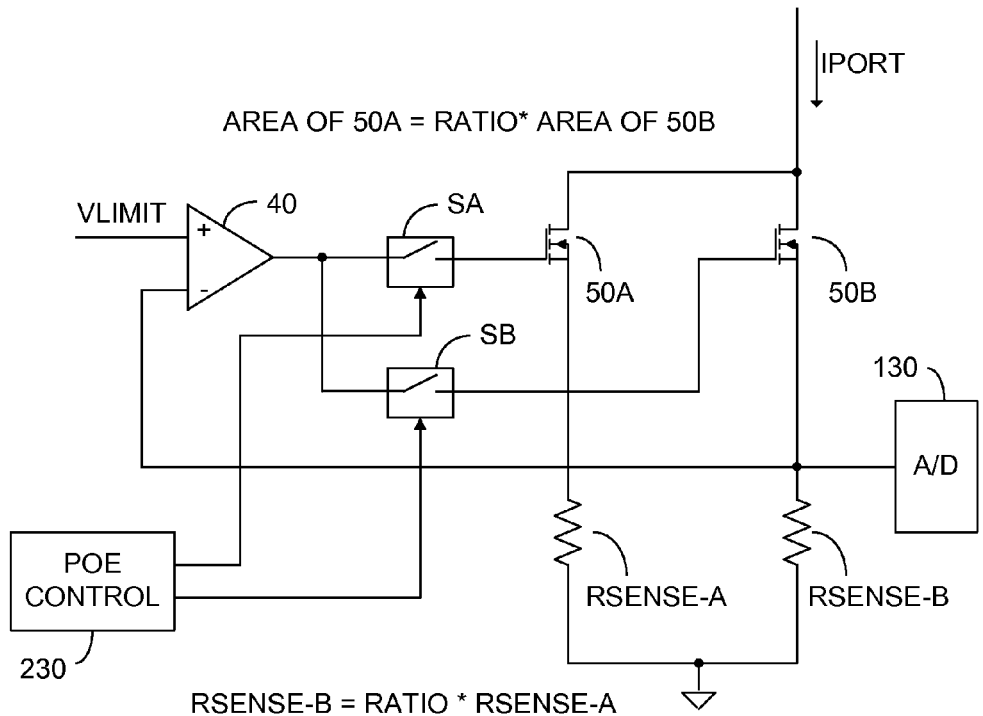
FIG. 4A illustrates a high level block diagram of an on-chip port current control arrangement, wherein a single A/D is arranged to handle a broad range of current control levels.

FIG. 4A illustrates a high level block diagram of an on-chip port current control arrangement 300 wherein a single ADC 130 is arranged to handle a broad range of current control levels, the current levels determined responsive to VLIMIT. Current control arrangement 300 comprises: differential amplifier 40; a first electronically controlled switch SA; a second electronically controlled switch SB; PoE control circuitry 230; a first NMOSFET 50A; a second NMOSFET 50B; a first sense resistor RSENSE-A; and a second sense resistor RSENSE-B. First NMOSFET 50A and second NMOSFET 50B are specific implementations of general electronically controlled switches, and are not restricted to NMOSFETs. Similarly, PoE control 230 is an embodiment of a general control circuitry, and is not meant to be limited to the specific art of PoE. The teachings herein are applicable to any circuitry wherein current limits are to be applied, and a broad range of currents are to be measured.

Limit voltage VLIMIT, which as described above may be set responsive to an output of PoE control 230, is coupled to the non-inverting input of differential amplifier 40. The output of differential amplifier 40 is coupled to a first terminal of first electronically controlled switch SA and to a first terminal of second electronically controlled switch SB. A second terminal of first electronically controlled switch SA is coupled to the gate of first NMOSFET 50A and a second terminal of second electronically controlled switch SB is coupled to the gate of second NMOSFET 50B. The drains of each of first and second NMOSFETs 50A, 50B are commonly coupled to port 55, and current IPORT flows through port 55.

The source of first NMOSFET 50A is coupled to a first end of first sense resistor RSENSE-A. The source of second NMOSFET 50B is coupled to a first end of second sense resistor RSENSE-B, to the input of ADC 130 and to the inverting input of differential amplifier 40. A second end of each of first sense resistor RSENSE-A and second sense resistor RSENSE-B is coupled to a common potential, which in the embodiment of FIG. 3 is the return of power supply 210. Respective outputs of PoE control circuitry 230 are coupled to the control inputs of first electronically controlled switch SA and second electronically controlled switch SB. Multiplexer 120 of FIG. 2A is not shown for ease of understanding.

The ratio of the resistance of second sense resistor RSENSE-B to the resistance of first sense resistor RSENSE-A is set to a predetermined value, denoted RATIO, which is greater than 1. Thus, the resistance of first sense resistor RSENSE-A is less than the resistance of second resistor RSENSE-B. In one particular embodiment, which will be used for illustration purposes, the resistance of first sense resistor RSENSE-A is 0.114 ohms, and the resistance of second sense resistor RSENSE-B is 0.8 ohms, and thus RATIO is equal to 7. First NMOSFET 50A is constituted of an NMSOFET with a first area, denoted AREA-A and second NMOSFET 50B is constituted of an NMSOFET with a second area, denoted AREA-B. The relationship between AREA-B and AREA-A is set to 1/RATIO, in the illustrative example AREA-B is thus ⅟₇ of AREA-A. Thus, the relationship between the combined on-resistance of first NMOSFET 50A and first sense resistor RSENSE-A to the combined on-resistance of second NMOSFET 50B and second sense resistor RSENSE-B is determined by RATIO, and is independent of temperature factors.

Figure 4B:
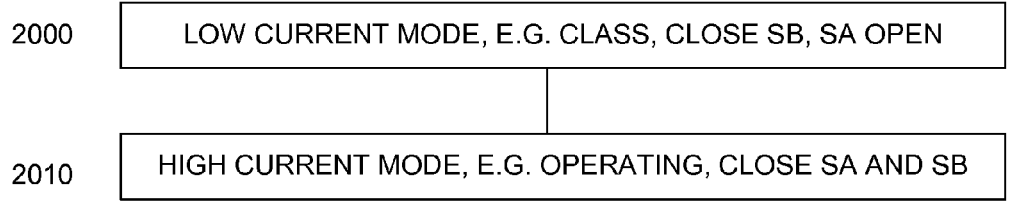
FIG. 4B illustrates a high level flow chart of the method of operation of the on-chip port current control arrangement of FIG. 4A.

FIG. 4B illustrates a high level block diagram of the method of operation of the on-chip port current control arrangement of FIG. 4A, FIGS. 4A and 4B being described together for clarity. In stage 2000, in order to control and measure a low current, such as a class current of PoE, PoE control circuitry 230 operates in a low current mode. In the low current mode PoE control circuitry 230 closes second electronically controlled switch SB, and sets first electronically controlled switch SA to be open. Current IPORT thus flows only through second NMOSFET 50B and through second sense resistor RSENSE-B, and develops VSENSE across second sense resistor RSENSE-B. For the illustrative example of classification of PoE currents, which are restricted to the range of 0-50 mA, voltage VSENSE presented to ADC 130 is thus in the range of up to 40 mV. Thus, second NMOSFET 50B and second sense resistor RSENSE-B present a single current path for current IPORT.

In stage 2010, in order to control operating currents, which in the illustrative example of PoE, may range from 350 mA-1 A, PoE control circuitry 230 operates in a high current mode. In the high current mode PoE control circuitry 230 closes first and second electronically controlled switches SA and SB. First sense resistor RSENSE-A is thus effectively in parallel with second sense resistor RSENSE-B. A first portion of current IPORT flows through a parallel current path presented by the serial combination of first NMOSFET 50A and first sense resistor RSENSE-A and a second portion of current IPORT flows through the serial combination of second NMOSFET 50B and second sense resistor RSENSE-B as described above in relation to the low current mode. Since the ratio of the area of second NMOSFET 50B to first NMOSFET 50A is inversely proportional to the ratio of second sense resistor RSENSE-B to first sense resistor RSENSE-A, i.e. RATIO, the current flow through the legs are similarly responsive to RATIO. First sense resistor RSENSE-A and second sense resistor RSENSE-B are effectively in parallel, and current IPORT flows through first sense resistor RSENSE-A and second sense resistor RSENSE-B in an amount responsive to RATIO. In particular, the current through second sense resistor RSENSE-B, which develops VSENSE is IPORT/(RATIO+1). By utilizing RATIO to determine both the areas of first NMOSFET 50A and second NMOSFET 50 as well as the resistances of first sense resistor RSENSE-A and second sense resistor RSENSE-B, the current is properly divided between the legs irrespective of temperature, since the resistance, and on-resistances, are at fixed ratios.

For the illustrative example of PoE, where RATIO=7, and RSENSE-A=0.8 ohms, and the current through IPORT is in the range of 350 mA to 1 A, VSENSE ranges from 35 mV to 100 mV, which is easily achievable by a standard ADC with a multiplier as part of the front end of the ADC (multiplier not shown).

Figure 5A:
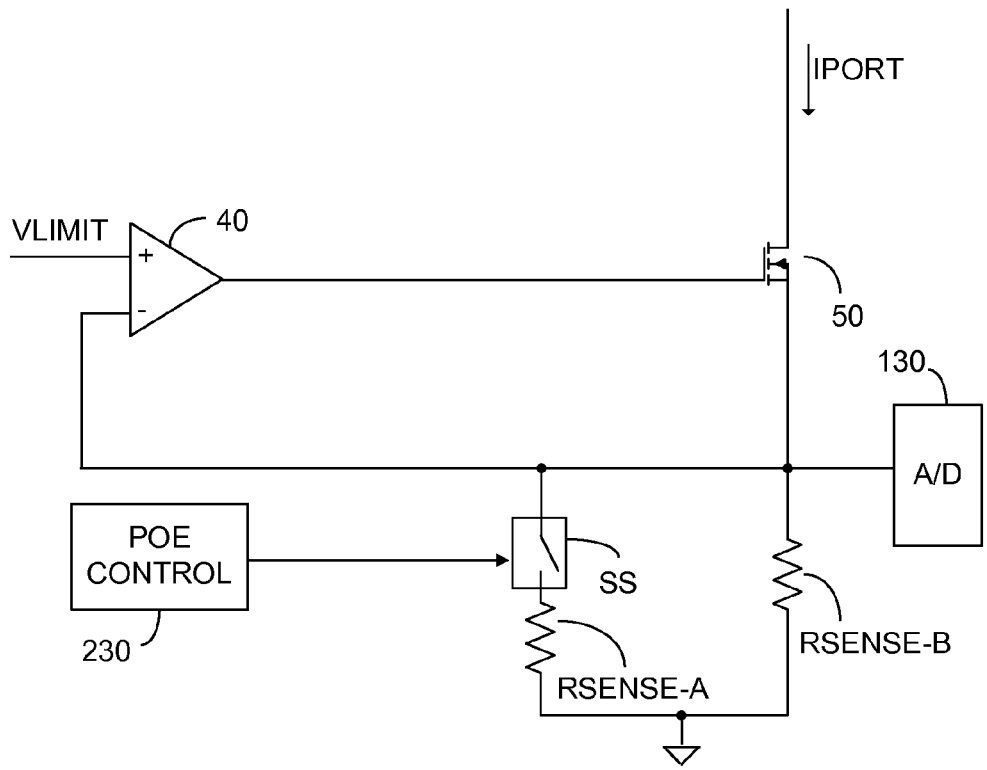
FIG. 5A illustrates a high level block diagram an input circuit for an single A/D such that the single A/D is arranged to handle a broad range of current control levels utilizing multiple sense resistors.

FIG. 5A illustrates a high level block diagram of an input circuit 400 for a single ADC 130, wherein ADC 130 is arranged to handle a broad range of current control levels, as described above in relation to FIGS. 4A and 4B. Input circuit 400 comprises: differential amplifier 40; an electronically controlled switch 50; an electronically controlled switch SS; PoE control circuitry 230; a first sense resistor RSENSE-A; and a second sense resistor RSENSE-B. Electronically controlled switch 50 is implemented in one non-limiting embodiment as an NMOSFET, however this is not meant to be limiting in any. Similarly, PoE control circuitry 230 is an embodiment of a general control circuitry, and is not meant to be limited to the specific art of PoE. The teachings herein are applicable to any circuitry wherein current limits are to be applied, and a broad range of currents are to be measured.

Limit voltage VLIMIT, which as described above may be set responsive to an output of PoE control 230, is coupled to the non-inverting input of differential amplifier 40. The output of differential amplifier 40 is coupled to the gate of electronically controlled switch 50. The inverting input of differential amplifier 40 is coupled to a first terminal of electronically controlled switch SS, to the source of electronically controlled switch 50, to a first end of second sense resistor RSENSE-B and to the input of ADC 130. A second terminal of electronically controlled switch SS is coupled to a first end of first sense resistor RSENSE-A and a control terminal of electronically controlled switch SS is coupled to an output of PoE control circuitry 230. A second end of first sense resistor RSENSE-A and second sense resistor RSENSE-B are each coupled to a common potential point. The drain of electronically controlled switch 50 is coupled to port 55 (not shown), and IPORT flows through port 55.

As described above, the ratio of the resistance of second sense resistor RSENSE-B to the resistance of first sense resistor RSENSE-A is set to a predetermined value, denoted RATIO2, which is greater than 1. Thus, the resistance of second sense resistor RSENSE-B is greater than the resistance of first resistor RSENSE-A. The on-resistance of electronically controlled switch SS is assumed to be negligible, and thus does not affect current flow.

Figure 5B:
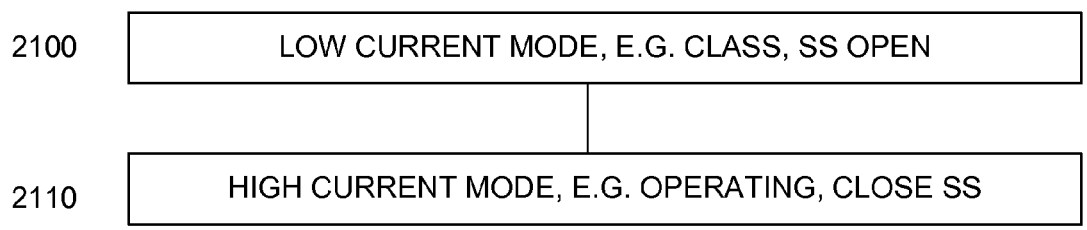
FIG. 5B illustrates a high level flow chart of the method of operation of the A/D input circuit of FIG. 5A.

FIG. 5B illustrates a high level block diagram of the method of operation of the input circuit of FIG. 5A, FIGS. 5A and 5B being described together for clarity. In stage 2100, in order to control and measure a low current, such as a class current of PoE which is restricted to the range of 0-50 mA, PoE control circuitry 230 operates in a low current mode. In the low current mode PoE control circuitry 230 sets electronically controlled switch SS to be open. Current IPORT thus flows only through electronically controlled switch 50 and through the single current path presented by second sense resistor RSENSE-B, and develops VSENSE across second sense resistor RSENSE-B.

In stage 2110, in order to control operating currents, which in the illustrative example of PoE, may range from 350 mA-1 A, PoE control circuitry 230 operates in a high current mode. In the high current mode PoE control circuitry 230 closes electronically controlled switch SS. First sense resistor RSENSE-A is thus in parallel with second sense resistor RSENSE-B, and a first portion of current IPORT flows through a parallel current path presented by first sense resistor RSENSE-A and a second potion flows through the current path presented by second sense resistor RSENSE-B as described above in relation to the low current mode. Since first sense resistor RSENSE-A and second sense resistor RSENSE-B are coupled in parallel, VSENSE is thus smaller than if electronically controlled switch SS is open and first sense resistor RSENSE-A is not coupled to second sense resistor RSENSE-B. Therefore, as described above in relation to FIGS. 4A-4B, in both the low current mode and the high current mode VSENSE is within a range easily achievable by a single standard ADC. As described above, differential amplifier 40 is arranged to control current IPORT by adjusting the gate voltage of electronically controlled switch 50.

Figure 6A:
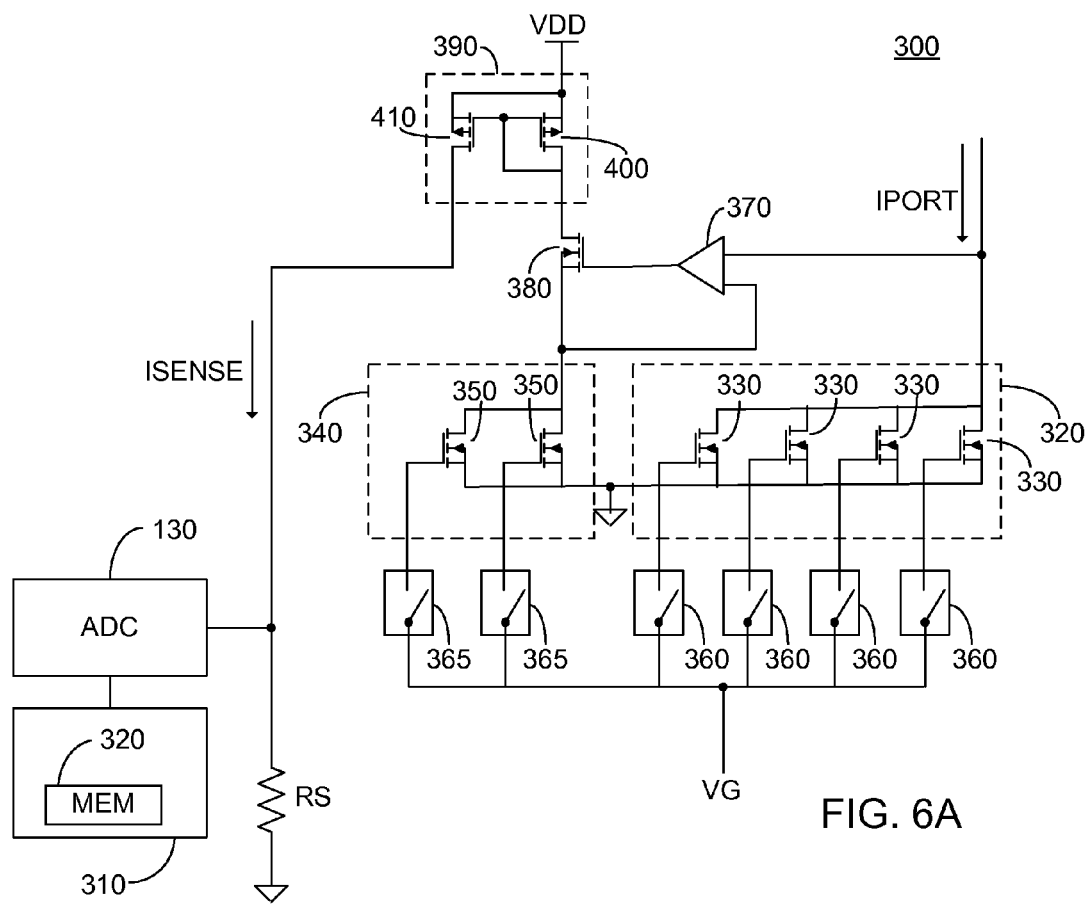
FIG. 6A illustrates a high level schematic diagram of a first exemplary embodiment of a wide range input apparatus for an analog to digital converter utilizing sense FETs.
Figure 6B:
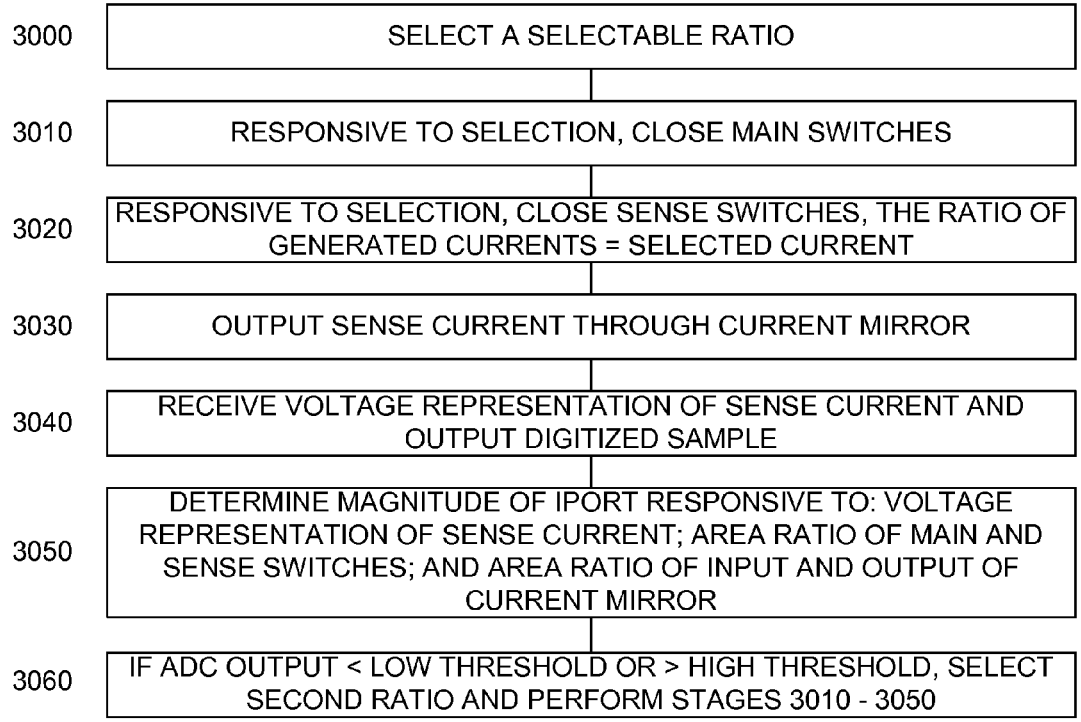
FIG. 6B illustrates a high level flow chart of the method of operation of the wide range input apparatus of FIG. 6A.

FIG. 6A illustrates a high level schematic diagram of a wide range input apparatus 300 for an ADC 130 and FIG. 6B illustrates a high level flow chart of the method of operation of apparatus 300. Apparatus 300 comprises: a control circuitry 310, comprising a memory 320; a plurality of main electronically controlled switches 330; a plurality of sense electronically controlled switches 350; a plurality of electronically controlled switches 360; a plurality of electronically controlled switches 365; an operational amplifier 370; an electronically controlled switch 380; a current mirror 390, comprising an input electronically controlled switch 400 and an output electronically controlled switch 410; and a sense impedance element, in one embodiment comprising a sense resistor RS. Each of main switches 330, sense switches 350 and switch 380 are described below as being implemented as an n-channel metal-oxide field effect transistor (NMOSFET), however this is not meant to be limiting in any way and other electronically controlled switches arranged to adjust the intensity of current flowing therethrough may be provided. For simplicity of understanding sense electronically controlled switches 350 will be alternately termed sense FETs 350, without being limiting. In one embodiment, a single semiconductor body 320 is provided, each main switch 330 comprising a particular cell of semiconductor body 320, and a single semiconductor body 340 is provided, each sense FET 350 comprising a particular cell of the semiconductor body. In another embodiment, each main switch 330 and sense FET 350 comprises a particular transistor cell of a single semiconductor body. Each of input electronically controlled switch 400 and output electronically controlled switch 410 of current mirror 390 are described below as being implemented as a p-channel metal-oxide field effect transistor (PMOSFET), however this is not meant to be limiting in any way and other electronically controlled switches arranged to adjust the intensity of current flowing therethrough may be provided.

The drains of main switches 330 are coupled to each other, and the sources of main switches 330 are coupled to a common potential. The gates of main switches 330 are each coupled to a first terminal of a respective electronically controlled switch 360 and a second terminal of each electronically controlled switch 360 is coupled to a common gate voltage, denoted VG. The control input of each electronically controlled switch 360 is coupled to a respective output of control circuitry 310 (connection not shown for simplicity). The drains of sense FETs 350 are coupled to each other, and the sources of sense FETs 350 are coupled to the common potential. The gates of sense FETs 350 are each coupled to a first terminal of a respective electronically controlled switch 365 and a second terminal of each electronically controlled switch 365 is coupled to gate voltage VG. The control input of each electronically controlled switch 365 is coupled to a respective output of control circuitry 310 (connections not shown). Thus, each main switch 330 has an associated electronically controlled switch 360 arranged to enable the operation thereof, and each sense FET 350 has an associated electronically controlled switch 365 arranged to enable the operation thereof.

A first input of operational amplifier 370 is coupled to the drains of sense FETs 350 and to the source of electronically controlled switch 380. A second input of operational amplifier 370 is coupled to the drains of main switches 330 and the output of operational amplifier 370 is coupled to the gate of electronically controlled switch 380. The drain of electronically controlled switch 380 is coupled to the drain of input electronically controlled switch 400 and to the gates of input electronically controlled switch 400 and output electronically controlled switch 410. The sources of input electronically controlled switch 400 and output electronically controlled switch 410 are commonly coupled to a supply voltage VDD and the drain of output electronically controlled switch 410 is coupled to a first end of sense resistor RS. A second end of sense resistor RS is coupled to the common potential and the first end of sense resistor RS is further coupled to an input of ADC 130.

In operation, in stage 3000 control circuitry 310 is arranged to select one of a plurality of predetermined selectable ratios stored on memory 320, as will be described further below. Responsive to the ratio selection of stage 3000, in stage 3010 control circuitry 310 is arranged to close one or more of electronically controlled switches 360, thereby applying gate voltage VG to the gates of the respective main switches 330. The applied gate voltage VG thus controls the respective main switches 330 and allows an input port current to flow therethrough, the input port current denoted IPORT as described above. In stage 3020, responsive to the ratio selection of stage 3000, control circuitry 310 is further arranged to close one or more of electronically controlled switches 365, thereby applying gate voltage VG to the gates of the respective sense FETs 350. The closed loop arrangement of operational amplifier 370 and electronically controlled switch 380 causes the drain voltages of sense FETs 350 to match the drain voltages of main switches 330. The drain, source and gate voltages of sense FETs 350 and main switches 330 are matched, and as a result the magnitude of the current flowing through sense FETs 350 is directly proportional to the current flowing through main switches 330, the ratio of the magnitude of the currents defined as the ratio of the total area of sense FETs 350 to the total area of main switches 330, the ratio being the ratio selected by control circuitry 310, as described above in stage 3000.

In stage 3030, the current generated by sense FETs 350 flows into current mirror 390 through input switch 400 and a directly proportional representation of the input current is generated through output switch 410, the ratio of the magnitudes of the input and output currents defined by the ratio of the areas of input switch 400 and output switch 410. Thus, a sense current, denoted ISENSE, is generated by sense FETs 350 and current mirror 390, the magnitude thereof being directly proportional to the magnitude of the input port current IPORT flowing through main switches 360. Current ISENSE flows through sense resistor RS and a voltage representation of current ISENSE is generated thereacross. In stage 3040, the voltage representation of current ISENSE is received by ADC 130 and a digitized output representation thereof is output from ADC 130 to control circuitry 310.

In stage 3050, control circuitry 310 is arranged to determine the magnitude of current IPORT responsive to: the digitally converted voltage representation of current ISENSE; the ratio of the areas of input switch 400 to output switch 410 of current mirror 390; and the ratio of the areas of the main switches 330 whose respective electronically controlled switches 360 are closed by control circuitry 310 to the areas of the sense FETs 350 whose respective electronically controlled switches 365 are closed by control circuitry 310. In one embodiment, the area of each main switch 330 and sense switch 350 is stored on memory 320, and control circuitry 310 is arranged to determine the ratio of the total area of the active sense FETs 350 to the total area of the active main switches 330. Additionally, the ratio of the input and output current of current mirror 390 is stored on memory 320. The magnitude of current IPORT is then determined responsive to the determined area ratio and the stored current ratio of current mirror 390. In another embodiment, the area of each main switch 330 and each sense FET 350 are equal to each other, the area ratio of the switches thus being determined responsive to the number of active sense FETs 350 and the number of active main switches 330. In one embodiment, all of main switches 330 are active responsive to the closing of all electronically controlled switches 360 and the ratio is determined by the number of active sense FETs.

In one embodiment, control circuitry 310 is arranged to select a first of the plurality of predetermined ratios stored on memory 320, as described above in relation to stage 3000, and analyze the digital voltage representation output by ADC 130. In the event that the output of ADC 130 is less than a predetermined low threshold, or is greater than a predetermined high threshold, in stage 3060 control circuitry 310 is arranged to select a second of the predetermined ratios stored on memory 320, and perform stages 3010-3050, as described above.

For example, in one embodiment the first selected ratio is 1/32000, i.e. 32000 main switches 330 and 1 sense FETs 350 are enabled, and the current ratio of current mirror 390 is 1/1, i.e. the areas of input switch 400 and output switch 410 are equal. In the event that the magnitude of current IPORT is relatively small, such as 5 mA, current ISENSE will exhibit a magnitude of 156 nA, which will generate a voltage across sense resistor RS which is too small for ADC 130 to reliable measure. Control circuitry 310 is thus unable to reliably determine the magnitude of current IPORT. Control circuitry 310 then selects a second ratio, such as 1/1000, i.e. 32000 main switches 330 and 32 sense switches 350 are enabled by closing the respective switches 360, 365, such that current ISENSE will exhibit a magnitude of 5 µA, which will generate a voltage across sense resistor RS which is in the operational range of ADC 130. In the event that the second ratio produces a current ISENSE which is too large, control circuitry 310 will keep selecting different ratios, according to a predetermined algorithm, until a current ISENSE is generated which is in the operating range of ADC 130.

Advantageously, a wide range of ratios is provided for currents IPORT and ISENSE, thereby allowing for use of a standard ADC to function with a wide range of input port currents. In one embodiment, the wide range of ratios comprises a plurality of ratios between 1/1000 and 1/32000. In certain embodiments main switches 360 are not provided, or are provided as a single switch. The ratio of area is then controlled by switches 365. Additionally, in such an embodiment the method of FIG. 9, described further below may be advantageously be utilized.

Figure 7:
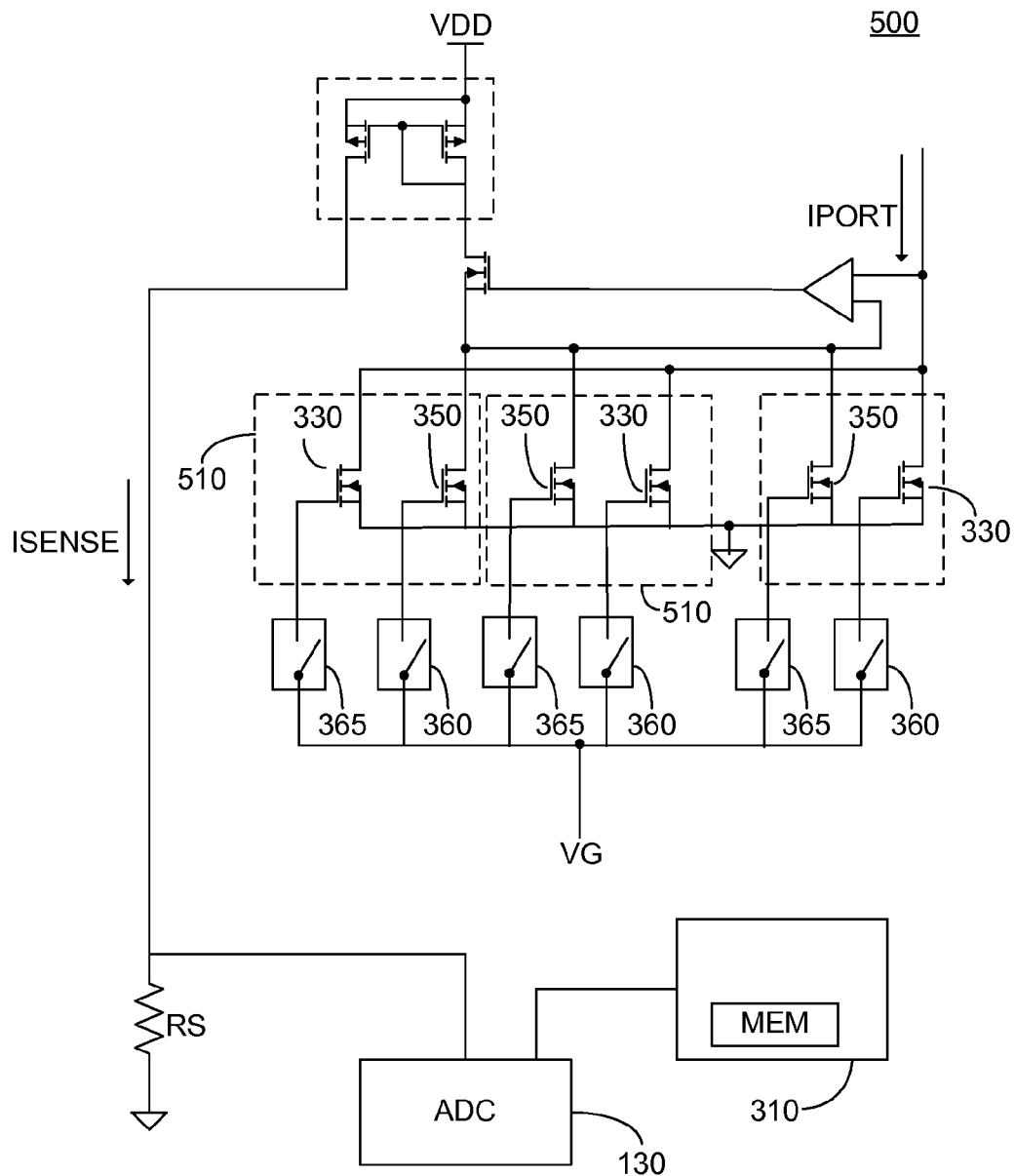
FIG. 7 illustrates a high level schematic diagram of a second exemplary embodiment of a wide range input apparatus for an analog to digital converter utilizing sense FETs, where the sense FETs are distributed in a pattern throughout the distribution pattern of main switches.

FIG. 7 illustrates a high level schematic diagram of a wide range input apparatus 500 for an ADC 130. Wide range input apparatus 500 is in all respects similar to wide range input apparatus 300 of FIG. 6A, with the exception that sense FETs 350 are distributed in a predetermined pattern throughout the distribution pattern of main switches 330. In one embodiment, sense FETs 350 are evenly distributed throughout the distribution pattern of main switches 330, each sense FET 350 and associated main switch(es) 330 shown as a set 510. The operation of wide range input apparatus 500 is in all respects similar to the operation of wide range input apparatus 300, with the exception that a plurality of sense currents ISENSE are generated, each via a particular set, or sets, 510 of sense switches 350, the magnitude of input port current IPORT determined as a function of the voltage representations of the plurality of generated sense currents. In particular, control circuitry 310 is arranged to select one of the plurality of selectable ratios stored on memory 315, as described above in relation to stage 3000. Control circuitry 310 is arranged to sequentially close a plurality of sets 510 of sense switches 350, the ratio of magnitude of the current ISENSE generated responsive to the closing of each set sense switch 510 and the magnitude of current IPORT being the selected ratio.

For example, in an embodiment where 32 sense FETS 350 are provided and 8 sense FETS 350 need to be enabled in order to provide the desired current ratio, while enabling all of the main switches 330, 4 sets 510 of 8 sense FETS 350 are sequentially closed. For each set 510 closed, a current ISENSE is generated and a voltage representation thereof is received by ADC 130, as described above in relation to FIG. 6A. Control circuitry 310 is arranged to determine the magnitude of current IPORT responsive to a function of the plurality of voltage representations received by ADC 130. In one embodiment, control circuitry 310 is arranged to determine a mathematical average of the received voltage representations, the magnitude of current IPORT determined responsive to the determined average.

As described above, the ratio of the magnitudes of current ISENSE and current IPORT is defined by the ratio of the total area of the enabled sense FETs 350 and the enabled main switches 330. However, the exact area ratio is not precisely known and is only a close approximation. In particular, as described above, in one embodiment each main switch 330 and sense FET 350 are single transistor cells of a single semiconductor body and the area ratio is defined by the number of enabled main switches and the number of enabled sense FETs. However, during manufacture of the semiconductor body, the transistor cells are not always split completely equally and therefore the ratio of the number of enabled sense FETs 350 to the number of enabled main switches 330 may not exactly equal the ratio of the total area of the enabled sense FETs 350 to the total area of the enabled main switches 330. Additionally, the capacitance and charge-carrier effective mobility of each transistor cell may not be exactly equal. Thus, the magnitude ratio of current ISENSE and current IPORT may not be exactly the same as the ratio of the number of enabled sense FETs 350 to the number of enabled main switches 330. Advantageously, determining an average of a plurality of currents ISENSE averages out the errors in the magnitude ratio, thereby providing a more accurate determination of the magnitude of current IPORT.

Additionally, the current flowing through main switches 330 and sense FETs 350 are a function of temperature. During operation, there may be a temperature gradient across the chip. Thus, the temperature of a main switch 330 situated in one part of the chip may be different than the temperature of a sense switch 330 in a second part of the chip, thereby the current flowing there through will not be equal as the current is also a function of temperature. As a result, the magnitude ratio of current ISENSE and current IPORT will not be exactly the same as the ratio of the number of enabled sense FETs 350 to the number of enabled main switches 330. Advantageously, the equal distribution of sense FETs 350 across the distribution pattern of main switches 330 provides sense FETs 350 with the same temperature gradient as main switches 330.

However, as described above, current ISENSE may be generated by closing only some of the plurality of sense FETs 350, thereby the temperature gradient on the enabled sense FETs 350 may not be equal to the temperature gradient on the enabled main switches 330. Advantageously, generating a plurality of currents ISENSE through different sense switch sets 510, each of which distributed throughout a different section of the main switch 330 distribution pattern, provides a plurality a plurality of currents ISENSE with the average temperature gradient equal to the average temperature gradient of main switches 330. Thus, determining an average of the magnitudes of the currents ISENSE provides a more accurate determination of the magnitude of current IPORT.

Figure 8:
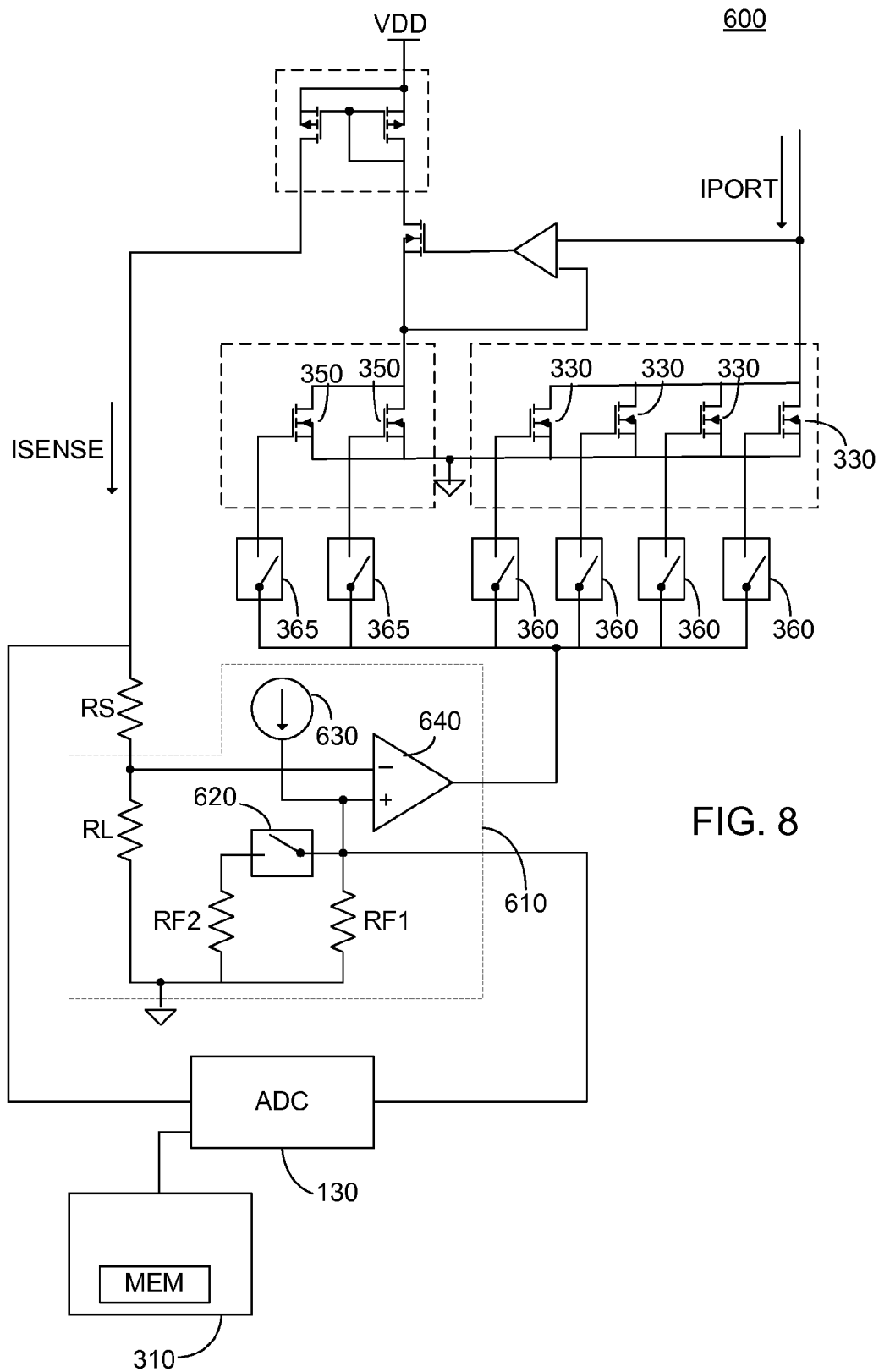
FIG. 8 illustrates a high level schematic diagram of a third exemplary embodiment of a wide range input apparatus for an analog to digital converter utilizing sense FETs with a current control circuit.

FIG. 8 illustrates a high level schematic diagram of a wide range input apparatus 600 for an ADC 130, according to certain embodiments. Wide range input apparatus 600 is in all respects similar to wide range input apparatus 300 of FIG. 6A with the exception that a current control circuit 610 is provided instead of gate voltage VG. Current control circuit 610 comprises: a limit impedance element, in one embodiment comprising a limit resistor RL; a first reference impedance element, in one embodiment comprising a reference resistor RF1; a second reference impedance element, in one embodiment comprising a reference resistor RF2; an electronically controlled switch 620; a reference current source 630; and an operational amplifier 640. Sense resistor RS, limit resistor RL, reference resistor RF1 and reference resistor RF2 are on-chip resistors, and exhibit a known resistance ratio therebetween.

Limit resistor RL is coupled between the second end of sense resistor RS and the common potential, and the second end of sense resistor RS is coupled to the inverting input of operational amplifier 640. The output of reference current source 630 is coupled to the non-inverting input of operational amplifier 640, to a first end of reference resistor RF1, to a respective input of ADC 130 and to a first terminal of electronically controlled switch 620. A second terminal of electronically controlled switch 620 is coupled to a first end of reference resistor RF2 and the second end of each of reference resistor RF1 and reference resistor RF2 is coupled to the common potential. The output of operational amplifier 640 is coupled to the second end of each of electronically controlled switches 360 and 365. A control input of reference current source 630 is coupled to a respective output of control circuitry 310 and a control input of electronically controlled switch 620 is coupled to a respective output of control circuitry 310 (connections not shown).

In operation, as described above, a current ISENSE is generated and a first voltage representation thereof is generated across sense resistor RS. Additionally, a second voltage representation thereof is generated across limit resistor RL, the sum of the first and second voltage representations being received by ADC 130. Control circuitry 310 is arranged to control reference current source 630 to output a reference current, denoted IREF, which flows through reference resistor RF2 and generates a reference voltage thereacross, which is received by ADC 130. As described above in relation to FIGS. 1A and 1B, the exact resistance of sense resistor RS, limit resistor RL and reference resistor RF1 isn't known, however the exact resistance ratios of the resistors are known. Therefore, control circuitry 310 is arranged to determine the magnitude of current ISENSE, generating a voltage representation across sense resistor RS and limit resistor RL, responsive to the voltage representation of the reference current generated across reference resistor RF1. As described above in relation to EQs. 5-7, precise current control may be obtained, and/or the precise resistance of sense resistor RS and limit resistor RL may be determined.

Current IPORT is controlled responsive to the operation of operational amplifier 640. In particular, in the event that the voltage representation of current ISENSE across limit resistor RL differs from the voltage representation of current IREF across reference resistor RF1, operational amplifier 640 will adjust the gate voltages of the enabled main switches 330 and sense FETs 350 so as to adjust currents IPORT and ISENSE to the desired magnitude. In one embodiment, in the event that a lower current IPORT is desired, control circuitry 310 is arranged to close electronically controlled switch 620 such that the voltage representation of current IREF is reduced, thereby reducing current IPORT.

Figure 9:
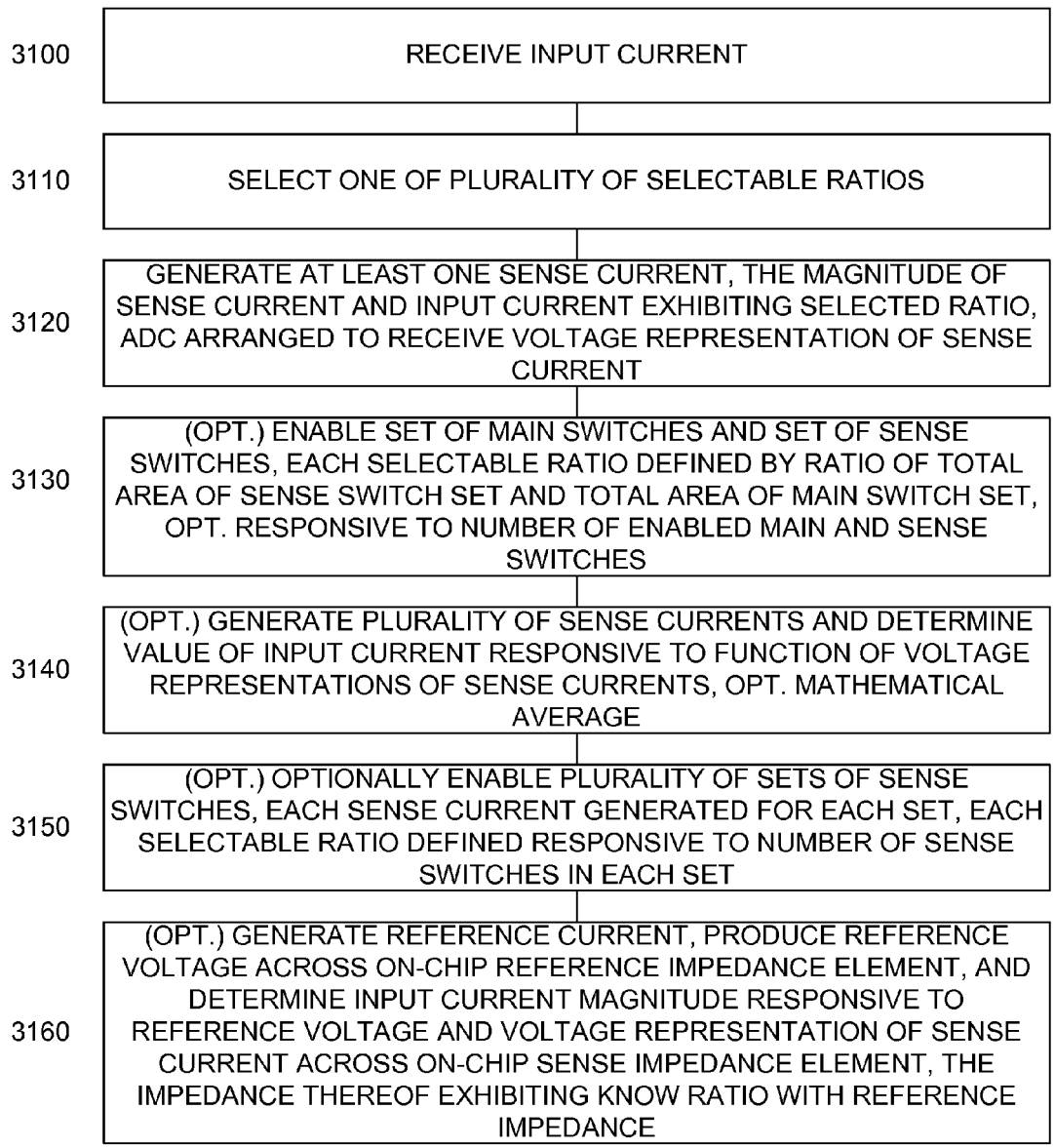
FIG. 9 illustrates a high level flow chart of a method of providing wide range input currents for an analog to digital converter, according to certain embodiments.

FIG. 9 illustrates a high level flow chart of a method of providing a wide range input currents for an ADC, according to certain embodiments. In stage 3100, an input current is received. In stage 3110, a ratio is selected from a plurality of predetermined selectable ratios. In stage 3120, at least one sense current is generated, the magnitudes of the generated at least one sense current and the received input current of stage 3100 exhibit the selected ratio of stage 3110. The ADC is arranged to receive a voltage representation of the generated at least one sense current.

In optional stage 3130, a set of main electronically controlled switches and a set of sense electronically controlled switches (sense FETs) are enabled. The input current of stage 3100 is received responsive to the enabling of the set of main electronically controlled switches and the at least one sense current of stage 3120 is generated responsive to the enabling of the set of sense electronically controlled switches. Each selectable ratio of stage 3110 is defined by the ratio of: the total area of the enabled sense switch set; to the total area of the enabled main switch set. Optionally, the total area ratio is defined by the ratio of the number of enabled sense switches to the number of enabled main switches.

In optional stage 3140, a plurality of sense currents are generated, a voltage representation of each of which is provided to the ADC, as described in stage 3120. The value of the magnitude of the received input current of stage 3100 is determined responsive to a function of the voltage representations of the plurality of generated sense currents. Optionally, the function comprises a mathematical average, such as an arithmetic average. In optional stage 3150, a plurality of sets of sense switches are enabled, each generated sense current of optional stage 3140 generated responsive to the enabling of a particular sense switch set. The ratio of the magnitude of each generated sense current to the magnitude of the received input current of stage 3100 defined by the number of sense switches within each sense switch set.

In optional stage 3160, a reference current is generated. A reference voltage is produced across an on-chip reference impedance element responsive to the generated reference current flowing therethrough, the reference voltage received by the ADC. The magnitude of the received input current of stage 3100 is determined responsive to the produced reference voltage and a voltage representation of the generated sense current of stage 3120 produced across an on-chip sense impedance element, the impedances of the on-chip sense impedance element and the on-chip reference impedance element exhibiting a predetermined known ratio.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

The terms "include", "comprise" and "have" and their conjugates as used herein mean "including but not necessarily limited to".

It will be appreciated by persons skilled in the art that the present invention is not limited to what has been particularly shown and described hereinabove. Rather the scope of the present invention is defined by the appended claims and includes both combinations and sub-combinations of the various features described hereinabove as well as variations and modifications thereof, which would occur to persons skilled in the art upon reading the foregoing description.

The invention claimed is:

1. A method of providing a wide range of input currents for an analog to digital converter (ADC), the method comprising:
   receiving an input current via a set of main electronically controlled switches having a main switch set area;
   generating at least one sense current via a set of sense electronically controlled switches having a sense switch set area; and
   selecting one of a plurality of selectable ratios of the sense switch set area to the main switch set area, the magnitudes of said at least one generated sense current and said received input current exhibiting said selected ratio,
   wherein the ADC is arranged to receive a voltage representation of said at least one generated sense current.

2. The method of claim 1, further comprising:
   enabling the set of main electronically controlled switches, the enabled set of main electronically controlled switches comprising at least one main transistor cell, said receiving an input current via the set of main electronically controlled switches responsive to said enabling of the set of main electronically controlled switches; and
   enabling a set of sense electronically controlled switches, said generated at least one sense current via the set of sense electronically controlled switches generated responsive to said enabling of the set of sense electronically controlled switches, the enabled set of sense electronically controlled switches comprising at least one sense transistor cell.

3. The method of claim 2, wherein said enabling of the set of main electronically controlled switches comprises coupling the gate of said enabled set of main electronically controlled switches to a fed back control voltage, the fed back control voltage responsive to the current flow through said enabled set of main electronically controlled switches.

4. The method of claim 3, wherein said enabling of the set of sense electronically controlled switches comprises coupling the gate of said enabled sense electronically controlled switches to the fed back control voltage.

5. The method of claim 1, wherein said generating at least one sense current comprises generating a plurality of sense currents each generated via a respective set of sense electronically controlled switches having a respective sense switch set area, the method further comprising determining the value of said received input current responsive to a function of the voltage representations of said plurality of generated sense currents.

6. The method of claim 5, wherein said function comprises an arithmetic average.

7. The method of claim 5, further comprising enabling the plurality of respective sets of sense electronically controlled switches, each of said plurality of sense currents generated responsive to said enabling of one of the respective sense electronically controlled switch sets,
   wherein the respective sense switch set area for each respective set of sense electronically controlled switches is defined by the number of sense electronically controlled switches in each respective set of sense electronically controlled switches.

8. The method of claim 1, further comprising enabling the set of sense electronically controlled switches, said generated at least one sense current via the set of sense electronically controlled switches generated responsive to said enabling of the set of sense electronically controlled switches,
   wherein the sense switch set area for the set of enabled sense electronically controlled switches is defined by the number of sense electronically controlled switches in the enabled set of sense electronically controlled switches.

9. The method of claim 8, further comprising:
   enabling the set of main electronically controlled switches, said receiving an input current via the set of main electronically controlled switches responsive to said enabling of the main switch set,
   wherein the main switch set area for the set of enabled main electronically controlled switches is defined by the number of main electronically controlled switches in the enabled set of main electronically controlled switches.

10. The method of claim 1, further comprising:
    generating a reference current;
    responsive to said generated reference current, producing a reference voltage across an on-chip reference impedance element, said generated reference voltage arranged to be received by the ADC; and
    determining the magnitude of said received input current responsive to said generated reference voltage and the voltage representation of said at least one generated sense current,
    wherein the sense current voltage representation is produced across an on-chip sense impedance element, the impedance of the on-chip sense impedance element exhibiting a predetermined ratio with the impedance of the on-chip reference impedance element.

11. A wide range input apparatus for an analog to digital converter (ADC), the wide range input apparatus comprising:
    a control circuitry;
    at least one main electronically controlled switch, responsive to said control circuitry; and
    at least one sense electronically controlled switch, responsive to said control circuitry,
    wherein said control circuitry is arranged to enable said at least one main electronically controlled switch, said enabled at least one main switch arranged to provide a controlled current path for an input current,
    wherein said control circuitry is further arranged to enable said at least one sense electronically controlled switch, said enabled at least one sense switch arranged to generate at least one sense current there through, a voltage representation of said at least one generated sense current arranged to be received by the ADC, and wherein the magnitudes of each of said at least one generated sense current and said received input current exhibit a selectable one of a plurality of ratios, said selectable ratio selected responsive to said control circuitry and defined by the ratio of the total area of said enabled at least one sense electronically controlled switch and said enabled at least one main electronically controlled switch.

12. The wide range input apparatus of claim 11, wherein said enabling of said at least one main electronically controlled switch comprises controllably coupling the gate of said enabled at least one main electronically controlled switch to a fed back control voltage via a respective enabling electronically controlled switch, the fed back control voltage responsive to the current flow through said enabled at least one main electronically controlled switch.

13. The wide range input apparatus of claim 12, wherein said enabling of said at least one sense electronically controlled switch comprises coupling the gate of said enabled at least one sense electronically controlled switch to the fed back control voltage.

14. The wide range input apparatus of claim 11, wherein said generated at least one sense current comprises a plurality of sense currents, said control circuitry further arranged to determine the value of said received input current responsive to a function of the voltage representations of said plurality of generated sense currents.

15. The wide range input apparatus of claim 14, wherein said function comprises an arithmetic average.

16. The wide range input apparatus of claim 14, wherein said at least one sense electronically controlled switch comprises a plurality of sense electronically controlled switches,
wherein said control circuitry is arranged to enable each of a plurality of sets of said sense electronically controlled switches at separate non-overlapping times, each of said sense electronically controlled switch sets comprising a portion of said plurality of sense electronically controlled switches,
wherein each of said plurality of sense currents is generated responsive to said enabled one of said sense switch sets with a respective selectable ratio, and
wherein each of said respective selectable ratios is defined by the number of sense electronically controlled switches in each enabled sense electronically controlled switch set.

17. The wide range input apparatus of claim 11, wherein said at least one sense electronically controlled switch comprises a plurality of sense electronically controlled switches and wherein said control circuitry is arranged to enable a plurality of sets of sense electronically controlled switches, each of said plurality of sense electronically controlled switch sets comprising a portion of said plurality of sense electronically controlled switches,
wherein said at least one sense current is generated responsive to said enabling of said sense electronically controlled switch set with a respective selectable ratio, and
wherein each of said respective selectable ratios is defined by the number of sense electronically controlled switches in said respective enabled sense electronically controlled switch set.

18. The apparatus of claim 17, wherein said at least one main electronically controlled switch comprises a plurality of main electronically controlled switches,
wherein said control circuitry is arranged to enable a set of main electronically controlled switches, said set of main switch electronically controlled switches comprises a portion of said plurality of main electronically controlled switches, said enabled main switch set providing said current path, and
wherein each of said respective selectable ratios is further defined by the number of main electronically controlled switches in the enabled main electronically controlled switch set.

19. The wide range input apparatus of claim 11, further comprising:
a reference current source arranged to generate a reference current;
an on-chip reference impedance element in communication with said reference current source, said generated reference current arranged to produce a reference voltage across said on-chip reference impedance element, said generated reference voltage arranged to be received by the ADC; and
an on-chip sense impedance element, the impedance of the on-chip sense impedance element exhibiting a predetermined ratio with the impedance of the on-chip reference impedance element,
wherein said control circuitry is arranged to determine the value of said received input current responsive to said produced reference voltage and the voltage representation of said at least one generated sense current,
wherein the sense current voltage representation is produced across an on-chip sense impedance element, the impedance of the on-chip sense impedance element exhibiting a predetermined ratio with the impedance of the on-chip reference impedance element.

20. A method of providing a wide range of input currents for an analog to digital converter (ADC), the method comprising:
receiving an input current through a first current path;
selecting one of a plurality of selectable values; and
generating at least one sense current through a second current path different from the first current path, the magnitude of said generated at least one sense current exhibiting a magnitude ratio to said received input current equal to said selected value,
wherein the ADC is arranged to receive a voltage representation of said generated at least one sense current.

* * * * *